(12) United States Patent
Baba et al.

(10) Patent No.: US 7,342,720 B2
(45) Date of Patent: Mar. 11, 2008

(54) SURFACE PROTECTIVE MEMBER FOR TRANSMISSION SCREEN

(75) Inventors: Shigeki Baba, Tokyo-To (JP); Norihiko Otaka, Tokyo-To (JP); Yukifumi Uotani, Tokyo-To (JP); Koichi Nakano, Tokyo-To (JP); Kazuyuki Shiozaki, Tokyo-To (JP); Koji Hashimoto, Tokyo-To (JP)

(73) Assignee: Dai Nippon Printing Co., Ltd., Shinjuku-Ku (JP)

( * ) Notice: Subject to any disclaimer, the term of this patent is extended or adjusted under 35 U.S.C. 154(b) by 210 days.

(21) Appl. No.: 11/147,410

(22) Filed: Jun. 7, 2005

(65) Prior Publication Data

US 2005/0280893 A1    Dec. 22, 2005

(30) Foreign Application Priority Data

Jun. 11, 2004   (JP)   ............... 2004-174150

(51) Int. Cl.
   *G03B 21/60*   (2006.01)
(52) U.S. Cl. .................. 359/453; 359/454; 359/457
(58) Field of Classification Search ......... 359/452–457
   See application file for complete search history.

(56) References Cited

U.S. PATENT DOCUMENTS

| | | | |
|---|---|---|---|
| 5,745,288 A * | 4/1998 | Miyata et al. ............... | 359/457 |
| 5,815,313 A * | 9/1998 | Mitani et al. ............... | 359/448 |
| 6,995,907 B2 * | 2/2006 | Osawa et al. ............... | 359/460 |
| 7,063,872 B1 * | 6/2006 | Amimori et al. ............ | 428/1.1 |
| 2006/0209403 A1 * | 9/2006 | Parusel et al. .............. | 359/453 |

FOREIGN PATENT DOCUMENTS

| | | |
|---|---|---|
| JP | 08-309910 A1 | 11/1996 |
| JP | 2002-365731 A1 | 12/2002 |
| JP | 2003-050307 | 2/2003 |
| JP | 2003-287819 | 10/2003 |
| JP | 2004-025650 | 1/2004 |
| JP | 2004-109966 | 4/2004 |
| KR | 1020040010328 | 1/2004 |
| KR | 1020040020031 | 3/2004 |

* cited by examiner

*Primary Examiner*—Diane I. Lee
*Assistant Examiner*—Magda Cruz
(74) *Attorney, Agent, or Firm*—Burr & Brown

(57) ABSTRACT

There is provided a surface protective member for a transmission screen that has excellent antireflective effect while maintaining a surface protective effect. The surface protective member for a transmission screen comprises a fine particle-containing hard coat layer provided on a transparent substrate, wherein the average particle diameter of the fine particles is 5 to 15 μm, the hard coat layer has a thickness satisfying a requirement represented by formula $(d-2) \leq t \leq d$ wherein t represents the thickness of the hard coat layer, μm; and d represents the average particle diameter of the fine particles, μm, and a part of the fine particles is projected on the surface of the hard coat layer to constitute concaves and convexes.

11 Claims, 3 Drawing Sheets

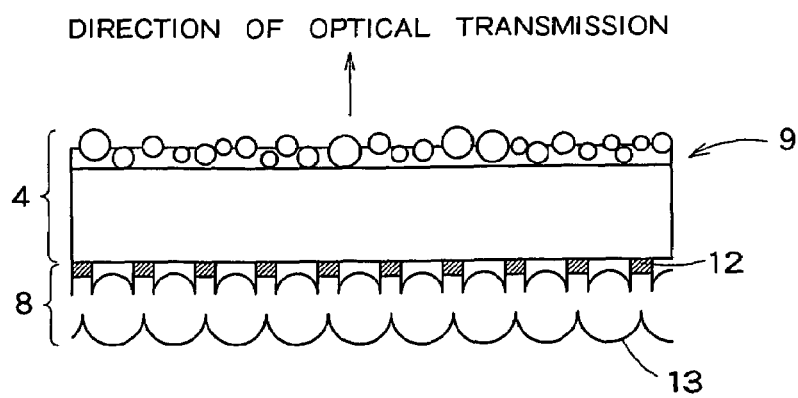
F I G. 4
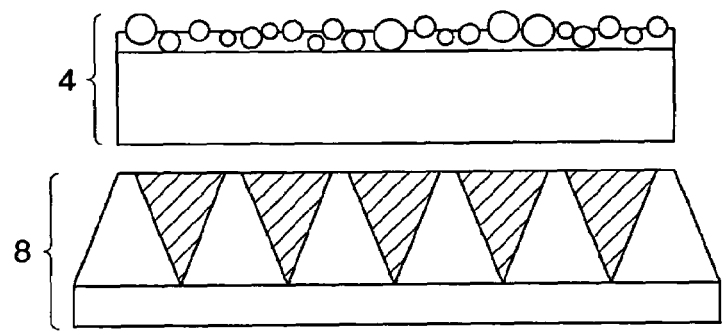
F I G. 5
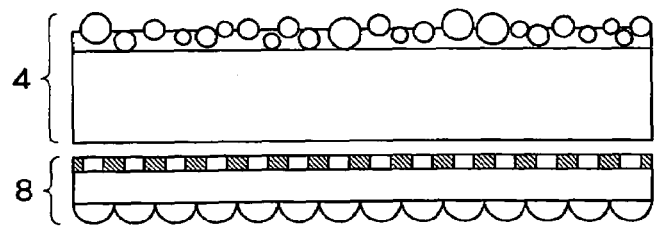
F I G. 6
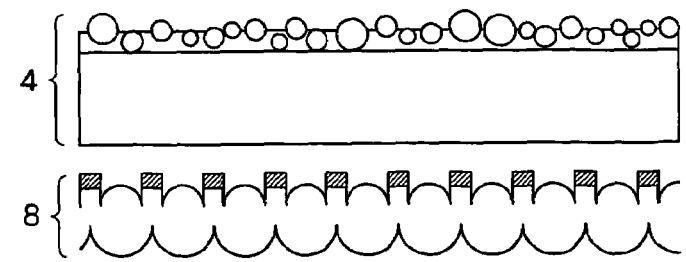
F I G. 7

SURFACE PROTECTIVE MEMBER FOR TRANSMISSION SCREEN

This application claims the benefit of Japanese Application No. 2004-174150, filed Jun. 11, 2004, the entirety of which is incorporated herein by reference.

BACKGROUND OF THE INVENTION

1. Field of the Invention

The present invention relates to a surface protective member for a transmission screen for use in transmission projection televisions and the like, and an optical member and a transmission screen using the surface protective member.

2. Background Art

Transmission projection televisions are display devices for enlarging and projecting images from light sources such as CRTs, liquid crystal projectors, or DLPs on a transmission screen. In such display devices, a light diffusing plate or the like for diffusing outgoing light is provided on the surface of the screen to reduce dazzling at the time of visual observation of the screen. Further, in order to reduce a deterioration in visibility of the projected image caused by external light-derived dazzling on the screen surface, an antireflection film is sometimes provided on the screen surface. As disclosed, for example, in Japanese Patent Laid-Open Nos. 295818/1999 and 28169/1995, the above light diffusing plate or antireflection film is prepared by incorporating transparent fine particles such as an organic filler in a resin constituting the light diffusing plate and the like. Further, a plate having both light diffusing effect and antireflection effect has been developed by allowing transparent fine particles to be projected on the surface of a resin to form concaves and convexes on the surface of a light diffusing plate.

The provision of a protective layer (also known as a hard coat layer) on the surface of the light diffusing plate for screen surface protection purposes, however, has posed a problem that the concaves and convexes on the surface of the light diffusing plate disappear making it impossible to attain the antireflection effect.

On the other hand, when an attempt is made to provide a protective layer in such a thickness that exhibits the antireflection effect, the thickness of the protective layer should be around the level of concaves and convexes on the surface of the light diffusing plate, that is, should be smaller than the particle diameter of the transparent fine particles, posing a problem that satisfactory surface protective effect cannot be attained.

SUMMARY OF THE INVENTION

The present inventors have now found that a surface protective member, which has satisfactory surface protective effect while maintaining antireflection effect, can be realized by, in providing a hard coat layer on a substrate to form a surface protective member for a transmission screen, regulating the content of the fine particles in the hard coat layer and the thickness of the resin constituting the hard coat layer. The present invention has been made based on such finding.

Accordingly, an object of the present invention is to provide a surface protective member for a transmission screen that has excellent antireflection effect while maintaining surface protective effect.

According to one aspect of the present invention, there is provided a surface protective member for a transmission screen, comprising a fine particle-containing hard coat layer provided on a transparent substrate having a single-layer or multilayer structure, wherein the average particle diameter of the fine particles is 5 to 15 μm, said hard coat layer has a thickness satisfying a requirement represented by formula $(d-2) \leq t \leq d$ wherein t represents the thickness of the hard coat layer, μm; and d represents the average particle diameter of the fine particles, μm, and a part of said fine particles is projected on the surface of the hard coat layer to constitute concaves and convexes. The term "transparent substrate" as used herein refers to a fully transparent substrate, as well as a semitransparent substrate.

Thus, the incorporation of fine particles having a predetermined particle diameter in a hard coat layer having a thickness equivalent to or smaller than the average particle diameter of the fine particles can realize satisfactory surface protective effect while maintaining antireflection effect.

According to another aspect of the present invention, there is provided an optical member for a transmission screen, comprising a combination of the surface protective member with a horizontal angle-of-view expanding member, said surface protective member for a transmission screen being disposed in the foreground in a light transmissive direction.

According to a further aspect of the present invention, there is provided a transmission screen comprising a combination of the optical member for a transmission screen with a Fresnel lens member. In the optical member and transmission screen using the surface protective member according to the present invention, satisfactory surface protective effect can be realized while maintaining antireflection effect, and, further, projected images free from harshness can be realized.

BRIEF DESCRIPTION OF THE DRAWINGS

FIG. 4 is a typical cross-sectional view showing one embodiment of an optical member using the surface protective member according to the present invention;

FIG. 5 is a typical cross-sectional view showing one embodiment of an optical member using the surface protective member according to the present invention;

FIG. 6 is a typical cross-sectional view showing one embodiment of an optical member using the surface protective member according to the present invention;

FIG. 7 is a typical cross-sectional view showing one embodiment of an optical member using the surface protective member according to the present invention;

DETAILED DESCRIPTION OF THE INVENTION

The surface protective member according to the present invention will be described in more detail.

Figure 1:
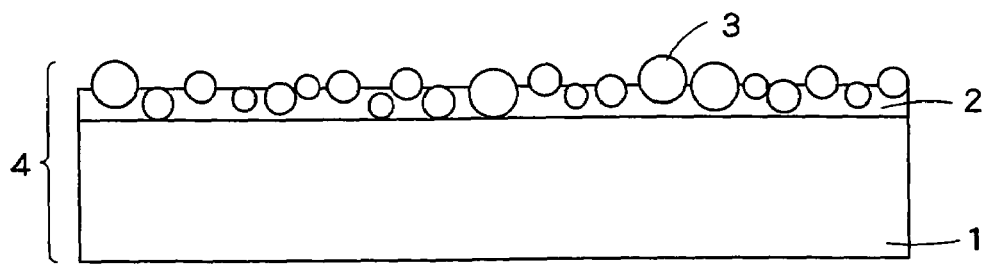
FIG. 1 is a typical cross-sectional view of a surface protective member according to the present invention.

As shown in FIG. 1, the surface protective member 4 according to the present invention has a structure comprising a hard coat layer 2 containing fine particles 3 provided on a transparent substrate 1. Concaves and convexes are formed on the surface of the hard coat layer 2 due to the projection of a part of the fine particles 3 contained in the hard coat layer. In order to provide this surface form, the average particle diameter of the fine particles should be 5 to 15 µm, and the thickness of the hard coat layer should satisfy a requirement represented by formula (d−2)≦t≦d wherein t represents the thickness of the hard coat layer, µm; and d represents the average particle diameter of the fine particles, µm. When the average particle diameter of the fine particles and the thickness of the hard coat layer are respectively in the above-defined ranges, concaves and convexes can be formed on the surface of the hard coat layer. When the thickness (t) of the hard coat layer is less than (d−2) µm, satisfactory surface hardness cannot be realized due to the influence of the hardness of the material of the underlying substrate, making it impossible to attain surface protective effect (scratch preventive effect of the screen). Further, the light diffusing effect attained by the fine particles projected from the hard coat layer is so high that the surface of the screen looks whitish due to scattering light derived from external light. On the other hand, when the thickness of the hard coat layer exceeds d µm, that is, when the thickness of the hard coat layer is larger than the average particle diameter of the fine particles, the fine particles are disadvantageously embedded in the hard coat layer and, consequently, the fine particles are not projected on the surface of the hard coat layer and do not form concaves and convexes and, thus the antireflection effect cannot be expected.

Preferably, the fine particles contained in the hard coat layer have a particle size distribution such that the standard deviation of particle diameters is not more than 4 µm. Here, the standard deviation σ is represented by formula $$\sigma = (n\Sigma d_n^2 - (\Sigma d_n)^2)^{1/2}/n$$

wherein $d_n$ represents the particle diameter of the fine particles, µm; and n represents an argument of the fine particles.

A surface protective member which is uniform and has excellent antireflection effect can be realized by using monodisperse fine particles with uniform particle diameter, for example, with a standard deviation of not more than 4 µm. On the other hand, when the standard deviation exceeds 4 µm, the proportion of particles having much larger diameters than the average particle diameter is so high that the uniformity in the surface is lost. Further, in this case, in the area where giant particles are present, the part projected from the hard coat layer is so large that the light diffusing effect is excessively large, and, consequently, the screen surface looks whitish due to external light-derived scattered light.

The content of the fine particles in the hard coat layer is preferably 1 to 10% by weight, more preferably 3 to 5% by weight. When the content of the fine particles is in the above-defined range, excellent antireflection effect and proper projection light transmittance can be simultaneously realized. When the content of the fine particles is less than 1% by weight, concaves and convexes on the surface of the hard coat layer are reduced, resulting in poor antireflection effect. On the other hand, when the content of the fine particles exceeds 10% by weight, the light diffusing effect attained by the fine particles is excessively large. Consequently, the haze value of the transmission screen is increased, making it impossible to provide satisfactory transmittance. Therefore, when this surface protective member is used in a screen, the projected image is highly harsh and is free from glossiness.

Further, in the present invention, preferably, the hard coat layer has a surface hardness of 3H or higher as measured by a pencil hardness test according to JIS K5600-5-4. The surface hardness of the hard coat layer depends upon the layer thickness, and the surface hardness increases with increasing the layer thickness. When the layer thickness is excessively large, the surface protective effect is enhanced. In this case, however, since the fine particles are embedded in the hard coat layer, concaves and convexes on the surface cannot be formed. Therefore, in order to provide a surface hardness of 3H or higher and, at the same time, to maintain the antireflection effect, the thickness of the hard coat layer should be (d−2)≦t≦d wherein d represents the average particle diameter of the fine particles, µm; and t represents the thickness of the hard coat layer, µm.

In the surface protective member according to the present invention, preferably, the hard coat layer provided on the substrate has a surface gloss of 60 to 80 as measured under conditions of angle of incidence 60 degrees/angle of reflection 60 degrees. Here the surface gloss refers to a relative value determined by using a glass plate having a refractive index of 1.567 as a standard gloss plate according to JIS K 5600 4-7 and presuming the surface gloss of the standard gloss plate to be 100. The hard coat layer constituting the surface protective member according to the present invention functions also as an antireflection film, and, when the surface gloss of the hard coat layer is 60 to 80, the antireflection effect is excellent for transmission screen applications. When the surface gloss is less than 60, the light diffusion on the surface of the hard coat layer is significant. Consequently, the haze value is increased, and light transmittance as the screen is lowered. On the other hand, when the surface gloss exceeds 80, the reflection of light from the surface of the hard coat layer is dominant. This disadvantageously causes external light-derived dazzling on the screen. The surface gloss may be measured with a conventional glossimeter (for example, a handy glossimeter: GLOSS CHECKER IG-330, manufactured by Sanwa Kenma Ltd.). In order that the hard coat layer has the above surface hardness and surface gloss, the content and average particle diameter of the fine particles in the hard coat layer and the thickness of the resin constituting the hard coat layer should be in the above-described respective ranges.

The hard coat layer for constituting the surface protective member according to the present invention may be a resin curable upon exposure to ultraviolet light or electron beams, that is, an ionizing radiation curing resin, a mixture of an ionizing radiation curing resin with a thermoplastic resin and a solvent, or a heat curing resin. Among them, the ionizing radiation curing resin is particularly preferred.

The film forming component in the ionizing radiation curing resin composition is preferably one containing an acrylate functional group, for example, one containing a relatively large amount of a relatively low-molecular weight polyester resin, a polyether resin, an acrylic resin, an epoxy resin, a urethane resin, an alkyd resin, a spiroacetal resin, a polybutadiene resin, or a polythiol-polyene resin, an oligomer or a prepolymer of (meth)acrylate or the like of a polyfunctional compound, such as polyhydric alcohol, and a reactive diluent, for example, a monofunctional monomer, such as ethyl(meth)acrylate, ethylhexyl (meth)acrylate, styrene, methyl styrene, and N-vinylpyrrolidone, and a polyfunctional monomer, for example, polymethylolpropane tri (meth)acrylate, hexanediol (meth)acrylate, tripropylene glycol di(meth)acrylate, diethylene glycol di(meth)acrylate, pentaerythritol tri(meth)acrylate, dipentaerythritol hexa(meth)acrylate, 1,6-hexanediol di(meth)acrylate, or neopentyl glycol di(meth)acrylate.

When the ionizing radiation curing resin composition is brought to an ultraviolet curing resin composition, a photopolymerization initiator, such as acetophenones, benzophenones, Michler's benzoyl benzoate, α-amyloxime esters, tetramethylthiuram monosulfide, or thioxanthones, and a photosensitizer, such as n-butylamine, triethylamine, or poly-n-butylphosphine, may be incorporated therein. In particular, in the present invention, urethane acrylate as an oligomer and dipentaerythritol hexa(meth)acrylate and the like as a monomer are preferably mixed.

The ionizing radiation curing resin composition may be cured by a conventional curing method for the ionizing radiation curing resin composition, that is, by electron beam or ultraviolet irradiation.

For example, in the case of curing by electron beam irradiation, use may be made of electron beams having an energy of 50 to 1000 keV, preferably 100 to 300 keV, emitted from various electron beam accelerators, such as Cockcroft-Walton accelerator, van de Graaff accelerator, resonance transformer, insulated core transformer, linear, dynamitron, and high-frequency electron accelerators. On the other hand, in the case of curing by ultraviolet irradiation, ultraviolet light emitted from light sources, such as ultrahigh pressure mercury lamps, high pressure mercury lamps, low pressure mercury lamps, carbon arc, xenon arc, and metal halide lamps, may be utilized.

The hard coat layer constituting the surface protective member according to the present invention may be formed by coating in a coating liquid of the above ionizing radiation (ultraviolet light) curing resin composition onto a surface of a substrate, for example, by spin coating, die coating, dip coating, bar coating, flow coating, roll coating, or gravure coating, and curing the coating by the above means.

Fine particles suitable for incorporation in the hard coat layer used in the present invention include organic fillers such as plastic beads. Particularly preferred are organic fillers which are highly transparent and has such a refractive index that the difference in refractive index between the organic filler and the hard coat layer which will be described later is about 0.05.

Plastic beads include melamine beads (refractive index 1.57), acryl beads (refractive index 1.49), acryl-styrene beads (refractive index 1.54), polycarbonate beads, polyethylene beads, polystyrene beads, and polyvinyl chloride beads. Among them, acrylic beads are preferred. As described above, the particle diameter of the plastic beads is 5 to 15 μm.

When fine particles are mixed as the organic filler in the hard coat layer, the organic filler is likely to settle in the resin for constituting the hard coat layer. An inorganic filler such as silica may be added for settling preventive purposes. The larger the amount of the inorganic filler added, the better the prevention of settling of the organic filler. In this case, however, the transparency of the coating film is adversely affected. For this reason, preferably, the addition of the inorganic filler in an amount of less than about 0.1% by weight based on the organic filler can prevent settling of the organic filler without sacrificing the transparency of the coating film.

Materials for the transparent substrate usable in the present invention include transparent resin films, transparent resin plates, transparent resin sheets, and transparent glass. Suitable transparent resin films usable herein include triacetyl cellulose (TAC), polyethylene terephthalate (PET), diacetylcellulose, cellulose acetate butyrate, polyether sulfone, polyacrylic resin, polyurethane resin, polyester, polycarbonate, polysulfone, polyether, polymethyl pentene, polyether ketone, and (meth)acrylonitrile films. The thickness thereof is generally about 25 to 2,000 μm, but is not particularly limited.

Figure 2:
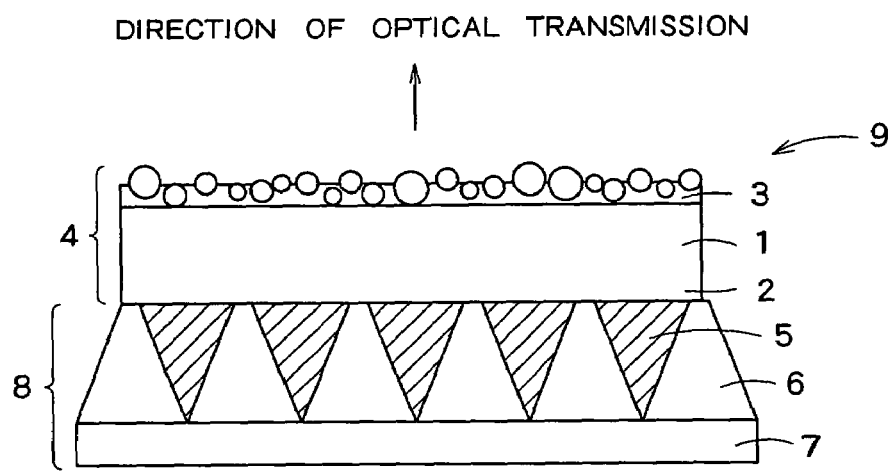
FIG. 2 is a typical cross-sectional view showing one embodiment of an optical member using the surface protective member according to the present invention.

Next, the transmission screen using the surface protective member according to the present invention will be described. As shown in FIG. 2, the surface protective member 4 according to the present invention can be used in combination with a horizontal angle-of-view expanding member 8. In the present invention, the surface protective member is disposed in the foreground in a light transmissive direction. In the optical member 9 shown in FIG. 2, the surface protective member is provided in the foreground in a light transmissive direction. The horizontal angle-of-view expanding member 8 usually has a structure comprising a lens 6 provided on a lens substrate 7. In the present invention, as shown in FIG. 2, a construction may be adopted in which a lens function is developed by combining a transparent resin part 6 and a light absorbing part 5 (a light shielding part) to constitute the interfacial boundary as a reflecting surface and the assembly of the transparent resin part 6 and the light absorbing part 5 is provided on the lens substrate 7 to constitute the horizontal angle-of-view expanding member. In the present invention, the combination of the horizontal angle-of-view expanding member 8 with the surface protective member can realize images which are free from external light-derived dazzling on the screen and have high visibility, good contrast and high sharpness and, at the same time, is excellent in surface protective effect, that is, scratch preventive effect of the screen surface.

Figure 3:
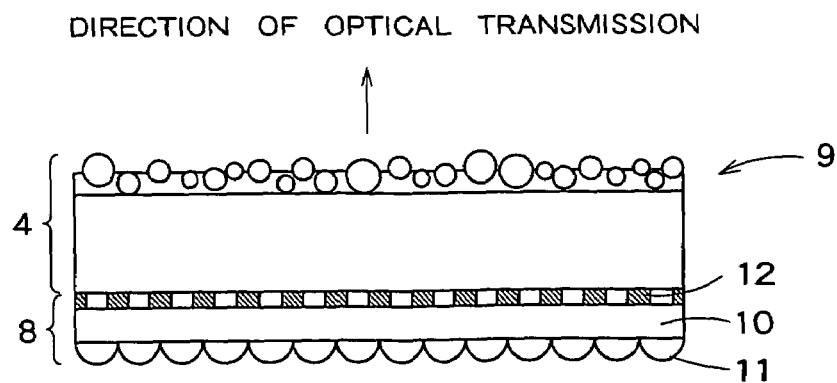
FIG. 3 is a typical cross-sectional view showing one embodiment of an optical member using the surface protective member according to the present invention.

Further, in the present invention, as shown in FIG. 3, the surface protective member 4 may be used in combination with a cylindrical lens member as the horizontal angle-of-view expanding member 8 to constitute an optical member 9. The cylindrical lens 11 is provided on one side of the lens substrate 10, and a light absorbing part 12 (a light shielding part) is provided on the other side of the lens substrate 10. As shown in FIG. 4, a lenticular lens member may be used as the horizontal angle-of-view expanding member 8 comprising a combination of the cylindrical lens member with the light absorbing member. A light diffusing plate (not shown) may be disposed between the horizontal angle-of-view expanding member 8 and the surface protective member 4.

In the optical member using the surface protective member, the surface protective member 4 may be bonded to the horizontal angle-of-view expanding member 8 through a pressure-sensitive adhesive layer (not shown). Further, as shown in FIGS. 5 to 7, the surface protective member 4 and the horizontal angle-of-view expanding member 8 may be combined in a non-bonded state.

Figure 8:
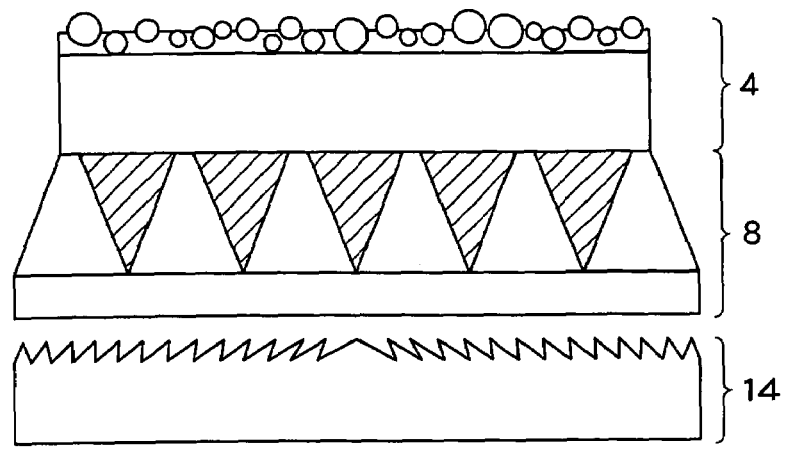
FIG. 8 is a typical cross-sectional view showing one embodiment of a transmission screen according to the present invention.
Figure 9:
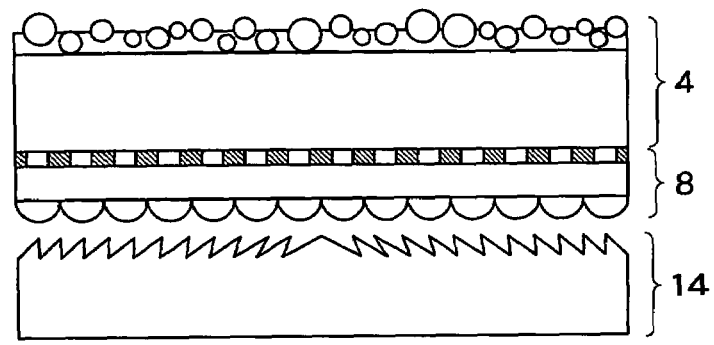
FIG. 9 is a typical cross-sectional view showing one embodiment of a transmission screen according to the present invention.
Figure 10:
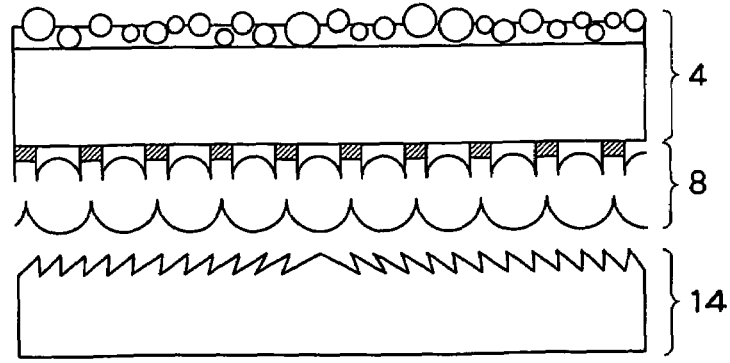
FIG. 10 is a typical cross-sectional view showing one embodiment of a transmission screen according to the present invention.

As shown in FIGS. 8 to 10, the transmission screen according to the present invention has a structure comprising a combination of the optical member with the Fresnel lens member 14. In the present invention, when the surface protective member 4 provided with a hard coat layer having a surface hardness of 3H or higher is disposed on the outermost surface (viewer's side) of the transmission screen, a transmission screen can be realized which is free from dazzling, derived from external light or the like, on the screen and is less likely to be scratched on the surface of the screen.

EXAMPLES

The following Examples further illustrate the present invention but are not intended to limit it.

A transparent plate formed of an MS resin (a methacryl-styrene copolymer resin) (refractive index 1.53) was provided as a resin used in a transparent substrate. Further, an ultraviolet curing resin composition composed mainly of urethane acrylate was used as a resin for hard coat layer formation. Resin beads formed of an MS resin (refractive index 1.53) were provided as fine particles to be added to this resin.

Production Example 1

Five types of resin beads having average particle diameters of 3 μm, 5 μm, 10 μm, 15 μm, and 18 μm were used. All of these resin beads were of a monodisperse type and had a standard deviation of 3 μm. The resin beads were mixed in the ultraviolet curing resin composition to a concentration of 3% by weight to prepare coating liquids.

Each of the coating liquids was then dip coated onto the transparent substrate. The coating was irradiated with ultraviolet light to cure the resin composition and thus to form a hard coat layer on the transparent substrate. Thus, a surface protective member was prepared. The thickness of the hard coat layer was regulated by regulating the speed of pulling up the transparent substrate from the coating liquid in the formation of the hard coat layer by dip coating. Surface protective members were prepared in the same manner as described above, except that the thickness of the hard coat layer was varied.

The thickness of the hard coat layer, and the average particle diameter, content and standard deviation of the resin beads used were as specified in Table 1.

TABLE 1

| Production Example 1 | Average particle diameter of resin beads, μm | Standard deviation of resin beads, μm | Content of resin beads, wt % | Thickness of hard coat layer, μm |
|---|---|---|---|---|
| A1 | 3 | 3 | 3 | 1 |
| A2 | 3 | 3 | 3 | 3 |
| A3 | 3 | 3 | 3 | 5 |
| A4 | 3 | 3 | 3 | 7 |
| A5 | 3 | 3 | 3 | 9 |
| A6 | 5 | 3 | 3 | 1 |
| A7 | 5 | 3 | 3 | 3 |
| A8 | 5 | 3 | 3 | 5 |
| A9 | 5 | 3 | 3 | 7 |
| A10 | 5 | 3 | 3 | 9 |
| A11 | 10 | 3 | 3 | 6 |
| A12 | 10 | 3 | 3 | 8 |
| A13 | 10 | 3 | 3 | 10 |
| A14 | 10 | 3 | 3 | 12 |
| A15 | 10 | 3 | 3 | 14 |
| A16 | 15 | 3 | 3 | 11 |
| A17 | 15 | 3 | 3 | 13 |
| A18 | 15 | 3 | 3 | 15 |
| A19 | 15 | 3 | 3 | 17 |
| A20 | 15 | 3 | 3 | 19 |

TABLE 1-continued

| Production Example 1 | Average particle diameter of resin beads, μm | Standard deviation of resin beads, μm | Content of resin beads, wt % | Thickness of hard coat layer, μm |
|---|---|---|---|---|
| A21 | 18 | 3 | 3 | 14 |
| A22 | 18 | 3 | 3 | 16 |
| A23 | 18 | 3 | 3 | 18 |
| A24 | 18 | 3 | 3 | 20 |
| A25 | 18 | 3 | 3 | 22 |

Production Example 2

Resin beads, which were of a monodisperse type and had an average particle diameter of 10 μm and a standard deviation of 3 μm, were used. The resin beads were mixed in the ultraviolet curing resin composition to the content (% by weight) specified in Table 2 below to prepare coating liquids.

Each of the coating liquids was then dip coated onto the transparent substrate. The coating was irradiated with ultraviolet light to cure the resin composition and thus to form a hard coat layer on the transparent substrate. In this case, the thickness of the hard coat layer was regulated to 10 μm by regulating the speed of pulling up the transparent substrate from the coating liquid. Thus, surface protective members with varied resin bead contents were prepared.

The thickness of the hard coat layer, and the average particle diameter, content and standard deviation of the resin beads used were as specified in Table 2.

TABLE 2

| Production Example 2 | Average particle diameter of resin beads, μm | Standard deviation of resin beads, μm | Content of resin beads, wt % | Thickness of hard coat layer, μm |
|---|---|---|---|---|
| B1 | 10 | 3 | 0.1 | 10 |
| B2 | 10 | 3 | 0.5 | 10 |
| B3 | 10 | 3 | 1 | 10 |
| B4 | 10 | 3 | 3 | 10 |
| B5 | 10 | 3 | 5 | 10 |
| B6 | 10 | 3 | 10 | 10 |
| B7 | 10 | 3 | 15 | 10 |
| B8 | 10 | 3 | 20 | 10 |

Production Example 3

Two types of resin beads with varied standard deviations were provided. Both the resin beads had an average particle diameter of 10 μm. The resin beads were mixed in the ultraviolet curing resin composition to a concentration of 3% by weight to prepare coating liquids. Each of the coating liquids was coated onto the transparent substrate in the same manner as in Production Example 2 to form a hard coat layer. In the same manner as in Production Example 2, the thickness of the hard coat layer was regulated to 10 μm. Thus, surface protective members with varied resin bead contents were prepared.

The thickness of the hard coat layer, and the average particle diameter, content and standard deviation of the resin beads used were as specified in Table 3.

TABLE 3

| Production Example 3 | Average particle diameter of resin beads, μm | Standard deviation of resin beads, μm | Content of resin beads, wt % | Thickness of hard coat layer, μm |
|---|---|---|---|---|
| C1 | 10 | 3 | 3 | 10 |
| C2 | 10 | 6 | 3 | 10 |

The surface gloss of hard coat layer was then measured for the surface protective members thus obtained, with a surface glossimeter (a handy glossimeter GLOSS CHECKER IG-330, manufactured by Sanwa Kenma Ltd.) under conditions of angle of incidence 60 degrees/angle of reflection 60 degrees.

Further, a pencil scratch test was carried out for the surface of the surface protective members on the hard coat layer side according to JIS K 5600 5-4.

Furthermore, a lenticular lens sheet and a Fresnel lens sheet were combined, and the surface protective member was incorporated on the lenticular lens side to prepare a transmission screen. The image quality of the screen was sensorily evaluated. Furthermore, in such a state that an image was projected on the transmission screen, external light was applied to the screen surface (surface protective member side) to evaluate an external light-derived dazzling on the screen surface. The evaluation of quality as a screen was further carried out by taking the results of the above evaluations together.

The results were evaluated according to the following criteria.

1. Evaluation on Image Quality

○: The viewing surface of the screen was bright, and the contour of the image was clear.

Δ: The viewing surface of the screen was somewhat white, and the contour of the image was somewhat blurry.

×: The viewing surface of the screen was whitish, and the contour of the image was blurry.

2. Evaluation on External Light-Derived Dazzling on Screen Surface

○: The external light-derived dazzling on screen surface was small, and the visibility of the image was good.

Δ: The external light-derived dazzling on screen surface was observed, but the visibility of the image was on a common level.

×: The external light-derived dazzling on screen surface was very large, and the visibility of the image was poor.

3. Overall Evaluation

⊚: The overall quality as a screen was good.

○: The overall quality as a screen was on a common level.

Δ: The overall quality as a screen was not very good.

×: The overall quality as a screen was poor.

The results of measurement and the results of evaluation were as shown in Table 4.

TABLE 4

| Production Example | Surface gloss | Surface hardness | Image quality | External light-derived dazzling | Overall evaluation |
|---|---|---|---|---|---|
| A1 | 40 | H | × | ○ | × |
| A2 | 73 | 2H | Δ | ○ | × |
| A3 | 91 | 3H | Δ | Δ | × |
| A4 | 110 | 3H | ○ | × | × |
| A5 | 134 | 3H | ○ | × | × |
| A6 | 35 | 2H | × | ○ | × |
| A7 | 62 | 3H | Δ | ○ | ○ |
| A8 | 77 | 3H | ○ | ○ | ⊚ |
| A9 | 90 | 3H | ○ | Δ | Δ |
| A10 | 105 | 3H | ○ | × | × |
| A11 | 39 | 3H | × | ○ | × |
| A12 | 65 | 3H | ○ | ○ | ⊚ |
| A13 | 75 | 3H | ○ | ○ | ⊚ |
| A14 | 99 | 3H | ○ | Δ | Δ |
| A15 | 118 | 4H | ○ | × | × |
| A16 | 51 | 3H | × | ○ | × |
| A17 | 61 | 3H | ○ | ○ | ⊚ |
| A18 | 78 | 4H | ○ | ○ | ⊚ |
| A19 | 92 | 4H | ○ | Δ | Δ |
| A20 | 120 | 4H | ○ | × | × |
| A21 | 44 | 3H | × | ○ | × |
| A22 | 66 | 4H | ○ | Δ | Δ |
| A23 | 74 | 4H | ○ | Δ | Δ |
| A24 | 95 | 4H | ○ | × | × |
| A25 | 114 | 4H | ○ | × | × |
| B1 | 108 | 3H | ○ | × | × |
| B2 | 93 | 3H | ○ | × | × |
| B3 | 80 | 3H | ○ | Δ | ○ |
| B4 | 75 | 3H | ○ | ○ | ⊚ |
| B5 | 69 | 3H | ○ | ○ | ⊚ |
| B6 | 61 | 3H | Δ | ○ | ○ |
| B7 | 49 | 3H | × | ○ | × |
| B8 | 43 | 3H | × | ○ | × |
| C1 | 75 | 3H | ○ | ○ | ⊚ |
| C2 | 63 | 3H | Δ | ○ | ○ |

The invention claimed is:

1. A surface protective member for a transmission screen, comprising a fine particle-containing hard coat layer provided on a transparent substrate, wherein
    the average particle diameter of the fine particles is 5 to 15 μm,
    said hard coat layer has a thickness satisfying a requirement represented by formula (d−2)≦t≦d wherein t represents the thickness of the hard coat layer in μm and d represents the average particle diameter of the fine particles in μm, and
    a part of said fine particles is projected on the surface of the hard coat layer to constitute concavities and convexities,
    wherein the content of the fine particles in the hard coat layer is 3 to 5% by weight.

2. The surface protective member for a transmission screen according to claim 1, wherein said fine particles have a particle size distribution such that the standard deviation of particle diameters is not more than 4 μm.

3. The surface protective member for a transmission screen according to claim 1, wherein said hard coat layer has a surface hardness of 3H or higher as measured by a pencil hardness test according to JIS K 5600 5-4.

4. The surface protective member for a transmission screen according to claim 1, wherein said hard coat layer has a surface gloss of 60 to 80 as measured under conditions of angle of incidence 60 degrees/angle of reflection 60 degrees.

5. The surface protective member for a transmission screen according to claim 1, wherein said hard coat layer comprises an ionizing radiation curing resin.

6. The surface protective member for a transmission screen according to claim 1, wherein said fine particles comprises an acryl-styrene copolymer resin.

7. An optical member for a transmission screen, comprising a combination of a surface protective member for a transmission screen according to claim 1 with a horizontal angle-of-view expanding member, said surface protective member for a transmission screen being disposed in the foreground in a light transmissive direction.

8. A transmission screen comprising a combination of an optical member according to claim 7 with a Fresnel lens member.

9. An optical member for a transmission screen, comprising a combination of a surface protective member for a transmission screen according to claim 1 with a lens member, said surface protective member for a transmission screen being disposed in the foreground in a light transmissive direction.

10. The optical member for a transmission screen according to claim 9, wherein said lens member comprises a lenticular lens member.

11. A transmission screen comprising a combination of a surface protective member for a transmission screen according to claim 1 with at least a Fresnel lens member.

* * * * *